US009824755B2

(12) United States Patent
Sohn et al.

(10) Patent No.: US 9,824,755 B2
(45) Date of Patent: Nov. 21, 2017

(54) SEMICONDUTOR MEMORY DEVICE AND MEMORY SYSTEM INCLUDING THE SAME

(71) Applicant: Samsung Electronics Co., Ltd., Suwon-si (KR)

(72) Inventors: Young-Soo Sohn, Seoul (KR); Chul-Woo Park, Yongin-si (KR); Kwang-Il Park, Yongin-si (KR); Hak-Soo Yu, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 226 days.

(21) Appl. No.: 14/465,995

(22) Filed: Aug. 22, 2014

(65) Prior Publication Data

US 2015/0134895 A1    May 14, 2015

(30) Foreign Application Priority Data

Nov. 12, 2013   (KR) .................. 10-2013-0137082

(51) Int. Cl.
| G06F 12/10 | (2016.01) |
| G11C 14/00 | (2006.01) |
| G11C 29/00 | (2006.01) |
| G11C 11/40 | (2006.01) |
| G11C 29/44 | (2006.01) |

(52) U.S. Cl.
CPC ........ G11C 14/0018 (2013.01); G11C 29/702 (2013.01); G11C 29/785 (2013.01); G11C 11/40 (2013.01); G11C 2029/4402 (2013.01)

(58) Field of Classification Search
CPC .................... G11C 14/0018; G06F 12/0292
USPC .......................................... 711/105
See application file for complete search history.

(56) References Cited

U.S. PATENT DOCUMENTS

| 5,255,235 | A | * | 10/1993 | Miyatake | ............ | G11C 11/4094 |
| | | | | | | 365/149 |
| 6,400,618 | B1 | | 6/2002 | Nakamura et al. | | |
| 6,944,074 | B2 | | 9/2005 | Chung et al. | | |
| 7,945,826 | B2 | | 5/2011 | Kameda et al. | | |
| 8,325,547 | B2 | | 12/2012 | Fujisaki | | |
| 2004/0196707 | A1 | * | 10/2004 | Yoon | ................... | G06F 12/0246 |
| | | | | | | 365/200 |
| 2009/0116317 | A1 | | 5/2009 | Kim | | |
| 2013/0055048 | A1 | | 2/2013 | Yu et al. | | |
| 2013/0083612 | A1 | | 4/2013 | Son et al. | | |

(Continued)

FOREIGN PATENT DOCUMENTS

| KR | 10-2002-0002913 A | 1/2002 |
| KR | 10-2002-0064560 A | 8/2002 |

(Continued)

Primary Examiner — Jae Yu
(74) Attorney, Agent, or Firm — Muir Patent Law, PLLC

(57) ABSTRACT

A semiconductor memory device may include a cell array comprising a plurality of memory cells, each memory cell connected to a word line and a bit line, the cell array divided into a plurality of blocks, each block including a plurality of word lines, the plurality of blocks including at least a first defective block; a nonvolatile storage circuit configured to store address information of the first defective block, and to output the address information to an external device; and a fuse circuit configured to cut off an activation of word lines of the first defective block.

13 Claims, 14 Drawing Sheets

(56) References Cited

U.S. PATENT DOCUMENTS

2013/0170274 A1 7/2013 Yu et al.
2014/0149652 A1 5/2014 Park et al.

FOREIGN PATENT DOCUMENTS

KR  10-2007-0064756 A  6/2007
KR  10-2014-0067879 A  6/2014

* cited by examiner

SEMICONDUTOR MEMORY DEVICE AND MEMORY SYSTEM INCLUDING THE SAME

CROSS-REFERENCE TO RELATED APPLICATIONS

This U.S. non-provisional patent application claims priority under 35 U.S.C. §119 to Korean Patent Application No. 10-2013-0137082, filed on Nov. 12, 2013, the entire contents of which are hereby incorporated by reference.

BACKGROUND

The present disclosure herein relates to a semiconductor memory device, and more particularly, to a semiconductor memory device managing a bad block and a memory system including the same.

The operating speeds of semiconductor memory devices constituting electronic systems are increasing. As integration of a semiconductor memory device increases, the number of memory cells that are integrated in a same area also increases. For example, in the case of dynamic random access memory (DRAM), as integration and performance are improved, yield is relatively decreased. In the case where failed cells are detected by a memory block unit, the failed cells are typically not easily repaired and thereby the DRAM including the failed cells is often rejected and not used.

SUMMARY

Exemplary embodiments provide a semiconductor memory device. The semiconductor memory device may include a cell array comprising a plurality of memory cells, each memory cell connected to a word line and a bit line, the cell array divided into a plurality of blocks, each block including a plurality of word lines, the plurality of blocks including at least a first defective block; a nonvolatile storage circuit configured to store address information of the at least one defective block, and to output the address information to an external device; and a fuse circuit configured to cut off an activation of word lines of the first defective block.

Other exemplary embodiments provide a memory system. The memory system may include a semiconductor memory device comprising a plurality of blocks including at least a first defective block, each block including a plurality of word lines, and the semiconductor memory device that stores information of the first defective block; and a host to receive information of the first defective block from the semiconductor memory device, and to access the semiconductor memory device based on the information of the first defective block. The semiconductor memory device cuts off an activation of word lines corresponding to the first defective block.

Still other exemplary embodiments provide a memory system. The memory system may include a memory device and a host. The memory device includes: a memory cell array including a plurality of memory cells each connected to a word line and a bit line, and divided into a first set of blocks, and a second set of blocks that includes at least a first defective block, each block including a plurality of word lines; and a row decoder configured to inactivate word lines of the second set of blocks. The first and second sets of blocks correspond to row addresses. The host is configured to receive address information of the second set of blocks, and access the memory device based on the address information.

DETAILED DESCRIPTION OF THE EMBODIMENTS

Figure 1:
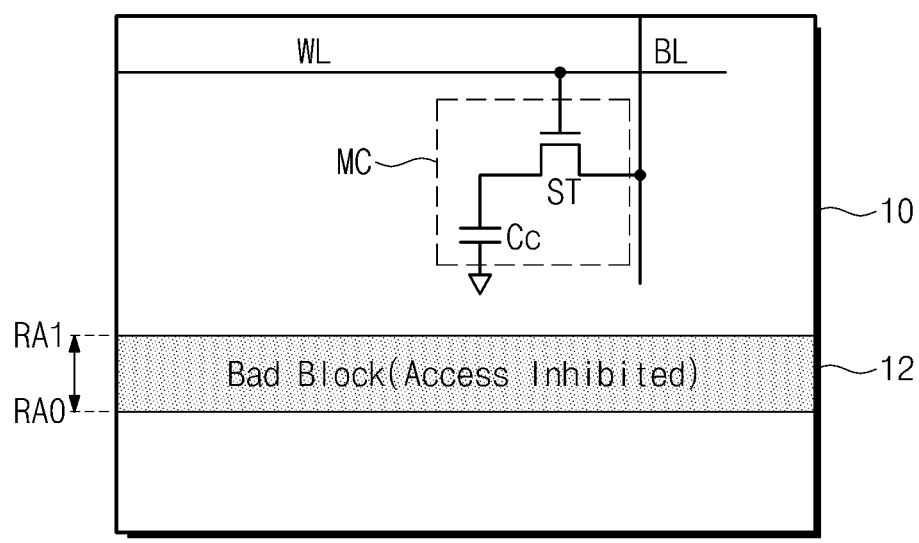
FIG. 1 is a block diagram illustrating a bad block in accordance with an exemplary embodiment.

Exemplary embodiments will be described more fully hereinafter with reference to the accompanying drawings, in which embodiments of the disclosure are shown. This disclosure may, however, be embodied in many different forms and should not be construed as limited to the embodiments set forth herein. In the drawings, the size and relative sizes of layers and regions may be exaggerated for clarity. Like numbers refer to like elements throughout.

The terminology used herein is for the purpose of describing particular embodiments only and is not intended to limit the disclosure. As used herein, the singular terms "a," "an" and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

Throughout the specification, it will also be understood that when an element is referred to as being "connected to" another element, it can be directly connected to the other element, or intervening elements may also be present. Similarly, it will also be understood that when an element is referred to as being "on" another element, it can be directly on the other element, or intervening elements may also be present. In contrast, the term "directly" means that there are no intervening elements. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. Unless indicated otherwise, these terms are only used to distinguish one element from another element. Thus, a first element in some embodiments could be termed a second element in other embodiments without departing from the teachings of the present disclosure. Exemplary embodiments of aspects of the present disclosure explained and illustrated herein include their complementary counterparts. The same reference numerals or the same reference designators denote the same elements throughout the specification.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram illustrating a bad block in accordance with an exemplary embodiment. Referring to FIG. 1, a semiconductor memory device includes a bad block 12 designated in a cell array 10. Memory cells included in the bad block 12 are set to be access-inhibited when necessary.

The cell array 10 includes a plurality of memory cells MC arranged along one or more rows and columns. Each memory cell MC may include a cell capacitor Cc and a selection transistor ST. A gate and a drain of the selection transistor ST are connected to a word line WL and a bit line BL respectively. A selection structure of the memory cells may be repeatedly formed by a word line WL unit. One word line WL corresponds to one row. Thus, one word line can be selected by one row address.

The cell array 10 may include the bad block 12. The bad block 12 may include a plurality of successive rows RA0~RA1 (e.g., 0000-1111). The bad block 12 has a row address range corresponding to at least one block. The rows RA0~RA1 designated as the bad block 12 have a row address range corresponding to at least one block. For example, the bad block includes one or more bad rows and a bad row includes at least one bad cell. One block may correspond to an area in which a sub word line driver SWD and a bit line sense amplifier BLSA cross each other.

In one embodiment, an access to the bad block 12 may be cut off. Address information of the bad block 12 may be provided to an external device (e.g., a controller or a host). Thus, an access to the bad block 12 from the outside can be inhibited. Moreover, when a periodic internal access operation is performed like a self-refresh operation, activation of word lines corresponding to the bad block 12 may also be inhibited. A fuse circuit may be added to provide a structure and functionality for that.

Figure 2:
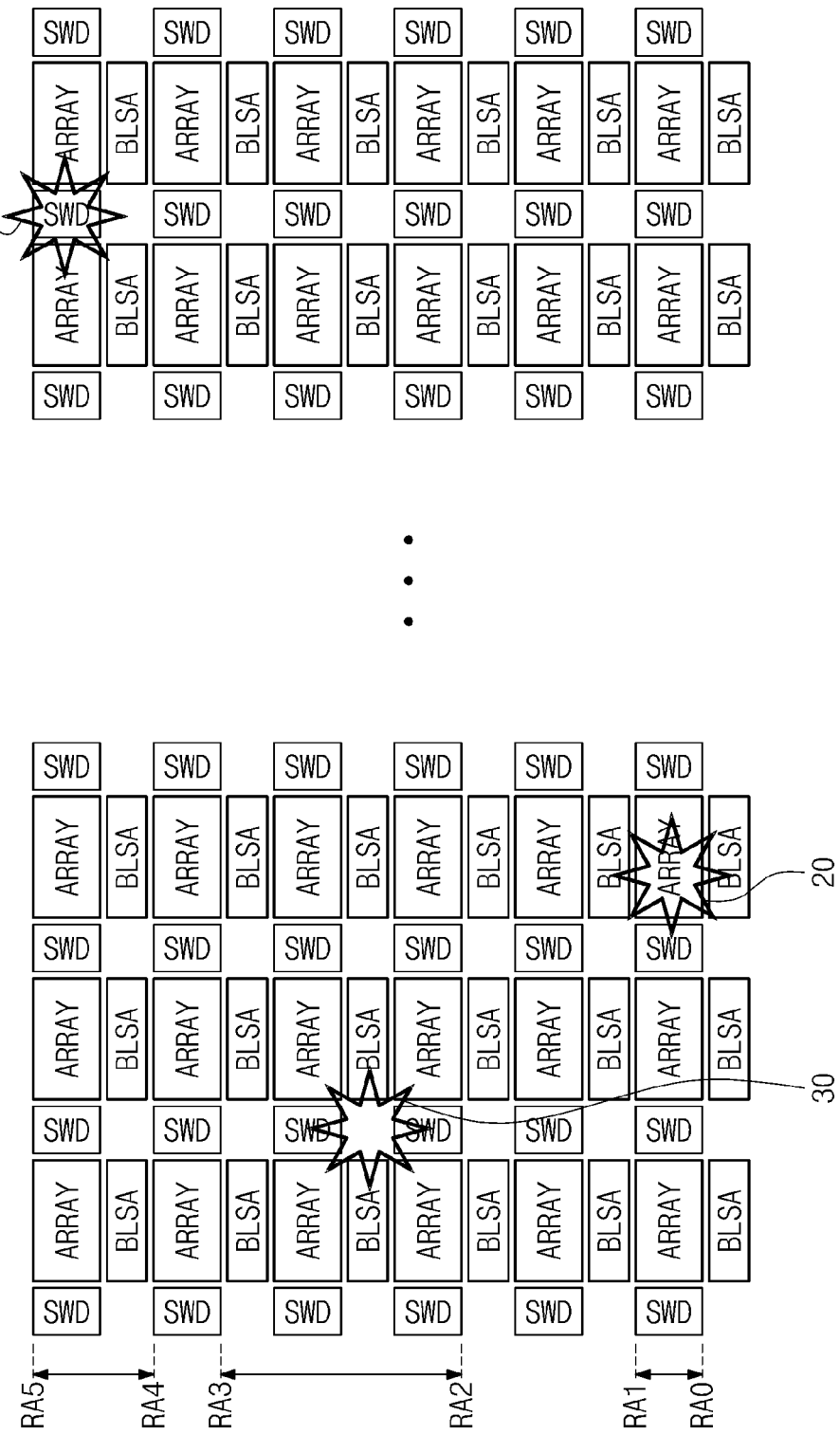
FIG. 2 is a block diagram illustrating a selection method of a bad block in accordance with exemplary embodiments.

FIG. 2 is a block diagram illustrating a selection method of a bad block in accordance with exemplary embodiments. Referring to FIG. 2, a cell array of a semiconductor memory device includes a plurality of blocks arranged along a row and a column.

For example, a defect 20 exists in a memory cell in a block, a range of row addresses RA0~RA1 associated with a corresponding block may be designated as a bad block BB. The defect 20 that occurs in a memory cell array may correspond to one row, but it may be a large-scale defect which is difficult to be repaired through a row redundancy scheme. The defect 20 may be, for example, a short among a plurality of word lines caused by a particle occurring in a manufacturing process or a defect caused by a burst of a specific memory area. In this case, since excessive repair resources are generally consumed to repair all the word lines using a row redundancy method, it is uneconomical.

A defect 30 shows an example of a defect for which at least two blocks adjacent to each other along a column direction and a row direction are processed to be a bad block BB. For example, a range of row addresses RA2~RA3 may be designated as a bad block BB by a defect of a control circuit or a bit line sense amplifier BLSA being disposed in adjacent areas of the blocks. A defect 40 shows an example of a defect that exists in a sub word line driver SWD or a global word line. If a problem occurs in a function of a control line for driving a sub word line driver SWD or in a function of a sub word line, at least two adjacent blocks covered by the sub word line driver SWD may be processed to be defective. Thus, in this case, a range of row addresses RA4~RA5 associated with a corresponding block may be designated as a bad block BB.

Examples of bad block BB were described above but the bad block BB is not limited to those examples. A specific row address range of a cell array may be designated as a bad block BB as a result of various defects besides those examples.

Figure 3:
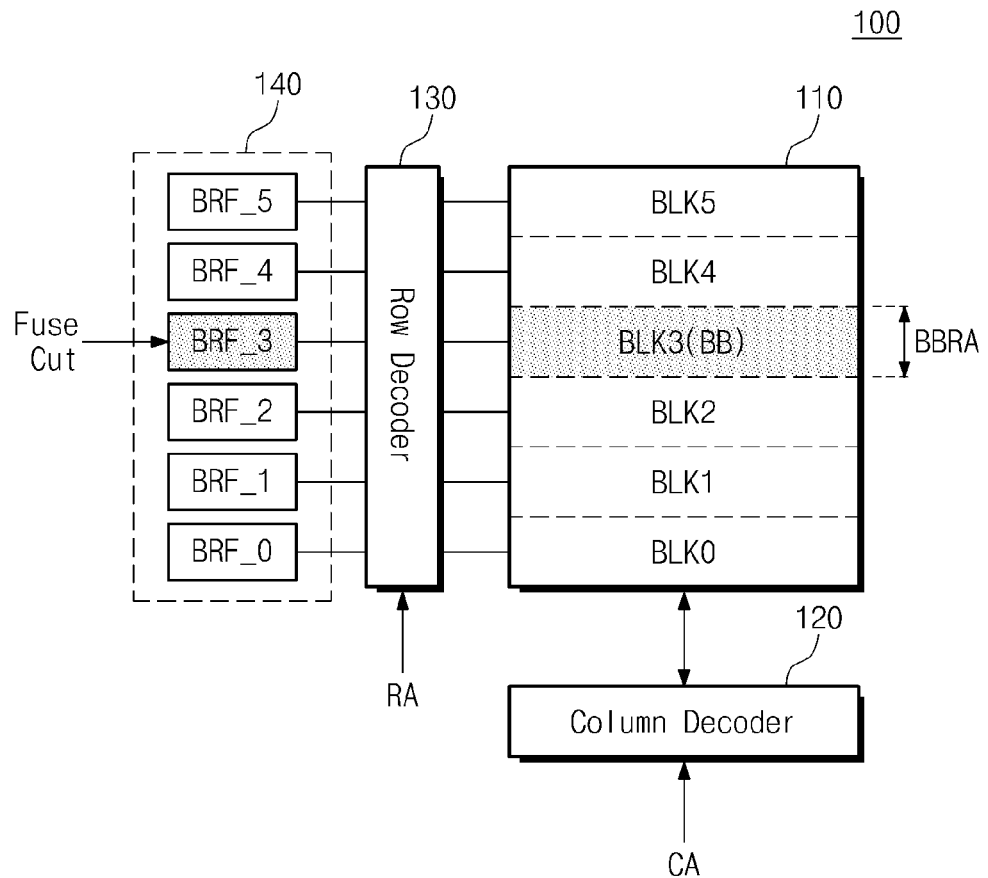
FIG. 3 is a block diagram illustrating a semiconductor memory device in accordance with an exemplary embodiment.

FIG. 3 is a block diagram illustrating a semiconductor memory device in accordance with an exemplary embodiment. Referring to FIG. 3, in the case that a bad block row address BBRA corresponds to a bad block BB, a semiconductor memory device 100 can cut off an activation of word lines designated as a bad block BB. To perform that function, the semiconductor memory device 100 may include, for example, a column decoder 120, a row decoder 130 and a fuse block 140.

In the cell array 110, a plurality of memory cells is connected to word lines and bit lines to be arranged in a row direction and a column direction, respectively. The cell array 110 may be divided into a plurality of blocks and each block includes a plurality of word lines. In the case that a defect occurs in any one block, all the rows associated with the any one block are designated as a bad block BB. Addresses of the rows designated as part of a bad block BB are designated as a bad block row address BBRA to be inhibited from an access. For example, such as during a refresh operation, an activation of word lines corresponding to a bad block BB may be cut off.

The column decoder 120 selects a bit line in response to a column address CA. Data input to a bit line BL selected by the column decoder 120 is transmitted to the cell array 110. Data sensed from a bit line BL selected by the column decoder 120 is transmitted to an input/output buffer (not shown).

The row decoder 130 selects a word line of a memory cell to be accessed in response to a row address RA. The row decoder 130 decodes the row address RA to activate a corresponding word line. In a self refresh operation, the row decoder 130 can decode a row address RA being generated from an address counter (not shown) to activate a corresponding word line.

The fuse block 140 is programmed to cut off an access to a row of each block unit. The fuse block 140 may include fuse circuits BRF_0~BRF_5 for controlling an access to rows of block. For example, information about whether or not an access to each of block rows is possible is programmed in the fuse circuits BRF_0~BRF_5. For example, a fuse circuit BRF_3 may be blown to cut off an access to the block BLK3 designated as a bad block BB. In this case, activation of all word lines included in the block BLK3 is cut off. Thus, even in a refresh operation, word lines included in the block BLK3 are not activated.

The fuse block 140 may be replaced with a fuse box performing a program operation by applying a strong current or irradiating laser, an e-fuse performing a program operation by using an electrical method, or various nonvolatile memories.

A constitution of the semiconductor memory device 100 was simply described above. In some embodiments, a semiconductor memory device 100 such as described above cuts off an access to a defective block that cannot be repaired using a row redundancy method by a bad block BB process. Reliability of an operation can be improved by the fuse block 140 preventing word lines of a bad block BB from being activated during, for example, a self refresh operation.

Figure 4:
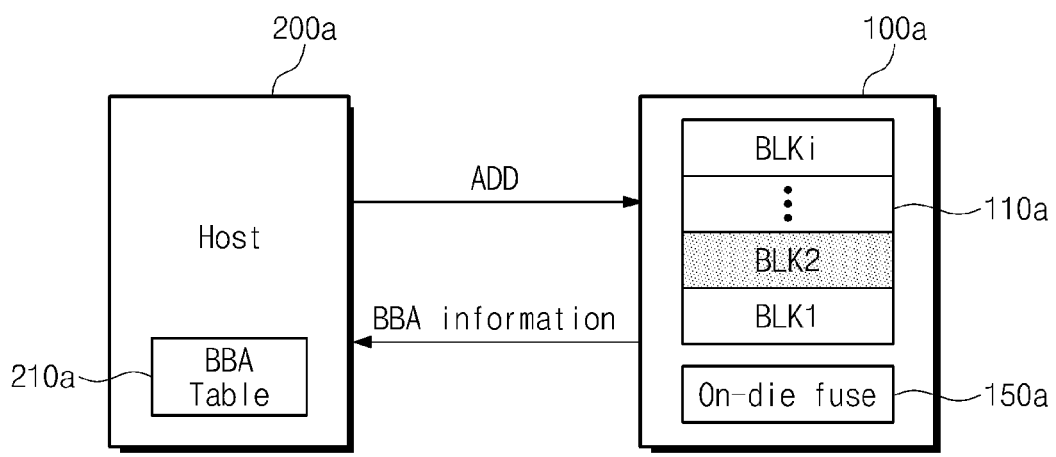
FIG. 4 is a block diagram illustrating a memory system in accordance with an exemplary embodiment.

FIG. 4 is a block diagram illustrating a memory system in accordance with an exemplary embodiment. Referring to FIG. 4, a memory system includes a semiconductor memory device 100a and a host 200a. The semiconductor memory device 100a may provide bad block address BBA information to the host 200a.

For example, the bad block address BBA information may include information of a range of row addresses designating a bad block BB. The range of the row addresses is referred to as a bad block row address BBRA.

In the cell array 110a, a bad block BB can be designated by a block unit. It is assumed that a range of row addresses corresponding to a block BLK2 is designated as a bad block row address BBRA. The semiconductor memory device 100a may include an on-die fuse block 150a. Address information about the bad block BB is stored in the on-die fuse block 150a. For example, the on-die fuse block 150a may include an anti-fuse circuit. However, a constitution of the on-die fuse block 150a is not limited to a fuse circuit. Various nonvolatile storage devices may be provided by a constitution of the on-die fuse block 150a.

The host 200a controls the semiconductor memory device 100a. The host 200a may control the semiconductor memory device 100a so that the semiconductor memory device 100a stores data or may request the semiconductor memory device 100a so that data stored in the semiconductor memory device 100a is output. The host 200a includes a bad block address table 210a to cut off generation of an address with respect to a bad block BB. The bad block address table 210a may be constituted on a SRAM being driven in the host 200a.

The host 200a reads bad block address (BBA) information from the on-die fuse block 150a included in the semiconductor memory device 100a when a booting operation of the memory system is performed. The host 200a constitutes the bad block address table 210a on the basis of the BBA information. When an access request to the semiconductor memory device 100a occurs, the host 200a generates an address for accessing to the semiconductor memory device 100a with reference to the bad block address table 210a. However, a row address corresponding to the bad block BB is inhibited in the host 200a.

A method that BBA information is transmitted from the semiconductor memory device 100a to the host 200a was described above.

In one embodiment, during a manufacturing process such as a test of a semiconductor memory device, information of a bad block address BBA may be programmed in the on-die fuse block 150a.

Figure 5:
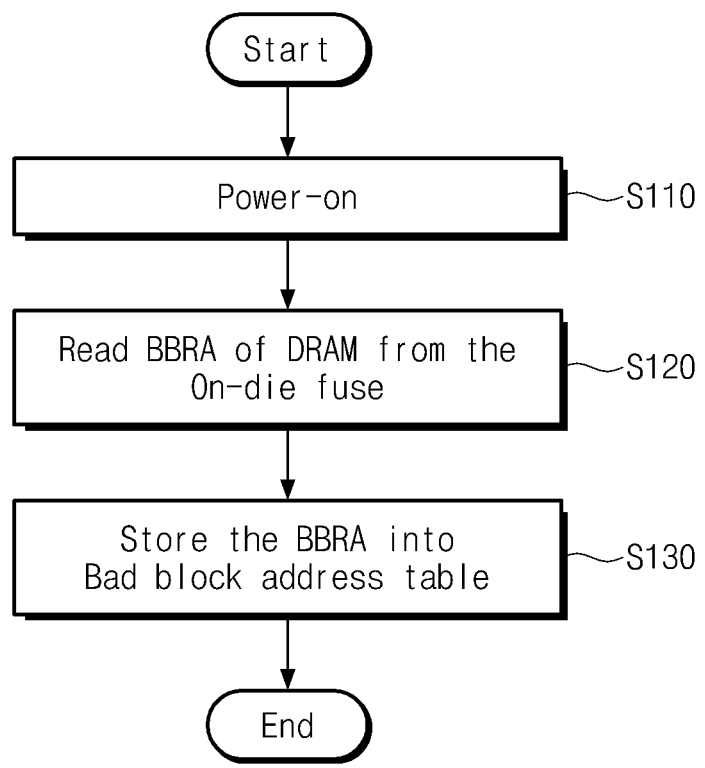
FIG. 5 is a flow chart illustrating an exemplary operating method of the memory system of FIG. 4.

FIG. 5 is a flow chart illustrating an exemplary operating method that in the memory system of FIG. 4, an address of a bad block is transmitted from the semiconductor memory device 100a to the host 200a. Referring to FIG. 5, when a booting or power-on operation of the memory system is performed, a bad block row address BBRA programmed in the on-die fuse block 150a may be transmitted to the host 200a.

In a step S110, if power is provided to a memory system, a power-on operation begins. However, the power-on operation may occur by a reset of the memory system or an initial operation of the memory system.

In a step S120, if a level of a power voltage being supplied to the host 200a and the semiconductor memory device 100a reaches a specific level, the semiconductor memory device 100a reads out data stored in the on-die fuse block 150a. The semiconductor memory device 100a transmits a bad block row address BBRA read from the on-die fuse block 150a to the host 200a.

In a step S130, the host 200a constitutes a bad block address table with reference to the bad block row address BBRA provided from the semiconductor memory device 100a. For example, an access to the semiconductor memory device 100a is performed with reference to the bad block address table 210a.

The method that host 200a is provided with bad block row address BBRA information (e.g., bad block address BBA information) from the semiconductor memory device 100a including the on-die fuse block 150a was described above.

Figure 6:
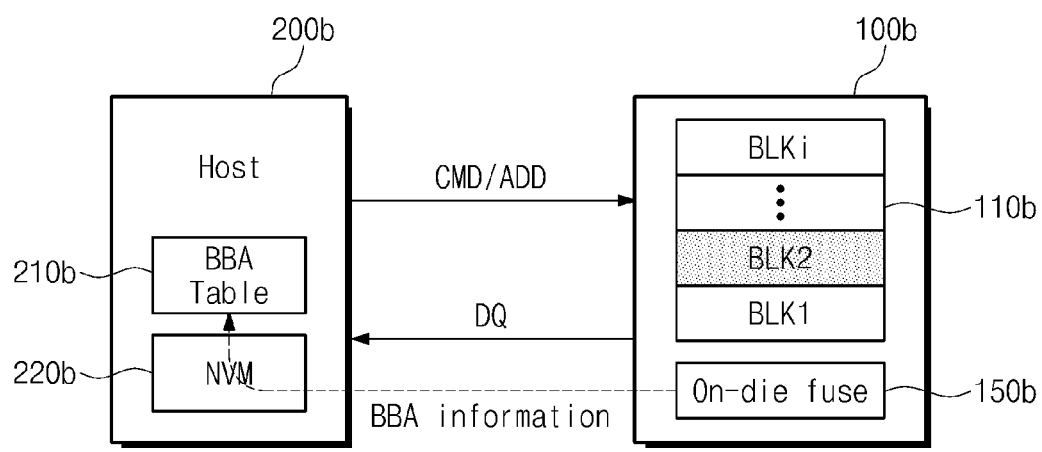
FIG. 6 is a block diagram illustrating a memory system in accordance with another exemplary embodiment.

FIG. 6 is a block diagram illustrating a memory system in accordance with another exemplary embodiment. Referring to FIG. 6, a memory system includes a semiconductor memory device 100b and a host 200b. Bad block address (BBA) information may be programmed in an on-die fuse block 150b, for example, in a test process of the semiconductor memory device 110b. In a memory system production process, the bad block address (BBA) information stored in the semiconductor memory device 100b is transmitted to a nonvolatile memory 220b of the host 200b. The bad block address (BBA) information stored in the nonvolatile memory 220b of the host 200b may be transmitted to a bad block address table 210b when a booting operation is performed.

The host 200b generates a command and an address with reference to the bad block address table 210b when the host 200*b* access to the semiconductor memory device 100*b*. The host 200*b* is set not to generate an address of the bad block BB corresponding to a bad block BLK2.

For example, the host 200*b* may be a memory controller for controlling the semiconductor memory device 100*b*. For example, the host 200*b* may be a memory managing unit MMU of a computing system including a function of the memory controller. The whole devices accessing to the semiconductor memory device 100*b* may be commonly called the host 200*b*.

Figure 7:
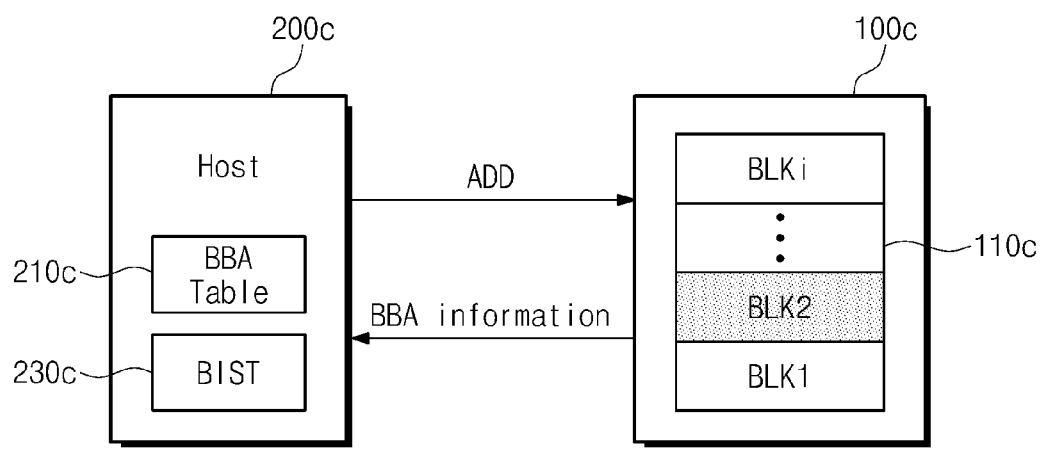
FIG. 7 is a block diagram illustrating a memory system in accordance with still another exemplary embodiment.

FIG. 7 is a block diagram illustrating a memory system in accordance with still another exemplary embodiment. Referring to FIG. 7, a memory system includes a semiconductor memory device 100*c* and a host 200*c*. The host 200*c* includes a built-in-self-test (BIST) device 230*c* performing a function of a BIST. The host 200*c* may obtain address information of a bad block BB of the semiconductor memory device 100*c* by the BIST.

The semiconductor memory device 100*c* may include blocks designated as a bad block BB. The semiconductor memory device 100*c* does not need to include a separate nonvolatile memory device for storing address information about a bad block BB. In a cell array 110*c*, a bad block BB can be designated by a block unit like FIG. 3 described above. In FIG. 7, row addresses corresponding to the block BLK2 can be designated as a bad block row address BBRA. The semiconductor memory device 100*c* may include a fuse circuit for cutting off activation of a bad block BB when a word line is selected like a refresh operation.

The host 200*c* controls the semiconductor memory device 100*c*. The host 200*c* may control the semiconductor memory device 100*c* so that the semiconductor memory device 100*c* stores data or may request the semiconductor memory device 100*c* so that data stored in the semiconductor memory device 100*c* is output. The host 200*c* includes a bad block address table 210*c* to cut off an access to a bad block BB. The bad block address table 210*c* may be constituted on a SRAM being driven in the host 200*c*.

The host 200*c* may perform a built-in-self-test (BIST) operation with respect to the semiconductor memory device 100*c*. The host 200*c* may perform a test autonomously when a booting or reset operation of the memory system is performed. The host 200*c* includes a test pattern with respect to the semiconductor memory device 100*c* among various test items. In addition, the host 200*c* may include a detecting operation with respect to a bad block BB among various test items with respect to the semiconductor memory device 100*c*. The host 200*c* can perform a general defect test and can collect a test result to generate address information about a bad block BB.

The host 200*c* obtains bad block (BB) information about the semiconductor memory device 100*c* by the BIST and the obtained information is loaded on the bad block address table 210*c*. When the host 200*c* accesses to the semiconductor memory device 100*c*, the host 200*c* generates a row address with reference to the bad block address table 210*c*. In this way, the host 200*c* can forbear to access to a row address designated as the bad block BB.

Figure 8:
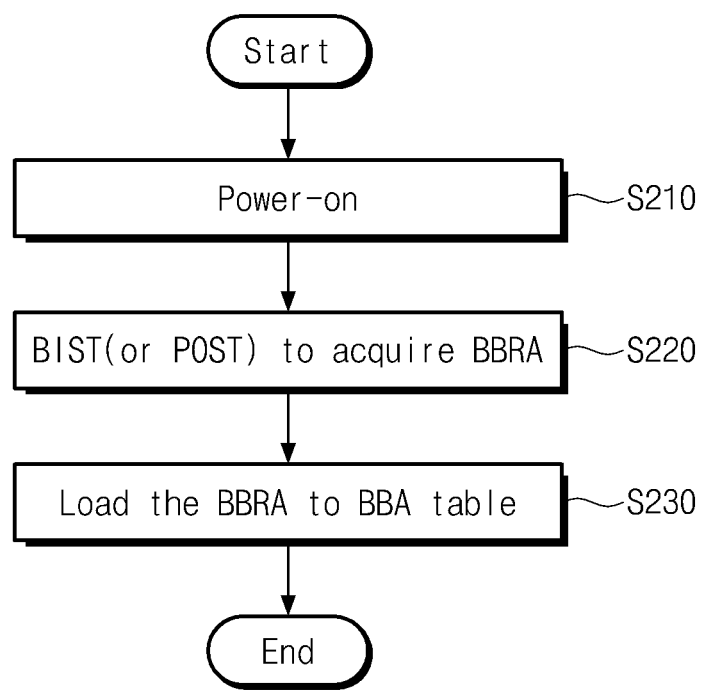
FIG. 8 is a flow chart illustrating an exemplary operating method of the memory system of FIG. 7.

FIG. 8 is a flow chart illustrating an exemplary operating method that a bad block row address BBRA in the memory system of FIG. 7 is transmitted from the semiconductor memory device 100*c* to the host 200*c*. Referring to FIG. 8, when a booting operation of the memory system is performed, the host 200*c* performs a test autonomously to obtain address information of the bad block BB of the semiconductor memory device 110*c*.

In a step S210, when a booting or power-on operation of the memory system is performed, the host 200*c* and the semiconductor memory device 100*c* are activated when a power voltage is applied.

In a step S220, if a level of the power voltage being provided to the host 200*c* and the semiconductor memory device 100*c* reaches a specific level, the semiconductor memory device 100*c* performs a built-in self-test (BIST) operation. The BIST operation may be a part of a power on self test (POST) operation. The host 200*c* transmits a test request to the semiconductor memory device 100*c* and can test whether or not the semiconductor memory device 100*c* is defective. For example, the host 200*c* and the semiconductor memory device 100*c* may detect a bad block BB of the semiconductor memory device 100*c* and transmit a bad block row address BBRA to the host 200*c* through a channel.

In a step S230, the host 200*c* updates the bad block row address BBRA transmitted by the built-in-self-test in the bad block address table 210*c*. After that, the host 200*c* accesses to the semiconductor memory device 100*c* with reference to information loaded on the bad block address table 210*c*.

A method that information of the bad block row address BBRA of the semiconductor memory device 100*c* is fetched to the host 200*c* by the built-in-self-test (BIST) was described above. In the case that the bad block row address BBRA of the semiconductor memory device 100*c* is detected by the built-in-self-test (BIST), the semiconductor memory device 100*c* does not need a constitution like the on-die fuse block. Thus, the unit cost of production of the semiconductor memory device 100*c* can be relatively lowered through the constitution of the memory system.

Figure 9:
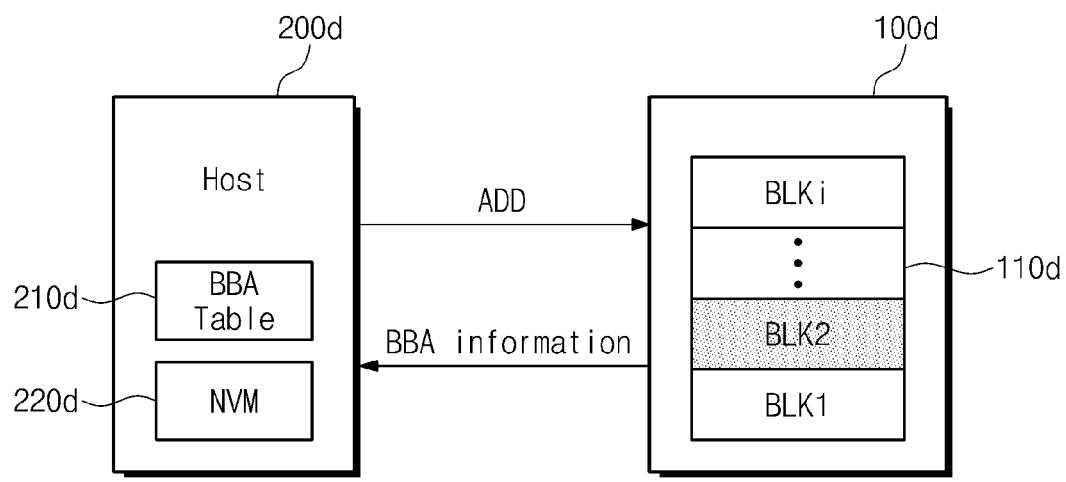
FIG. 9 is a block diagram illustrating a memory system in accordance with yet another exemplary embodiment.

FIG. 9 is a block diagram illustrating a memory system in accordance with yet another exemplary embodiment. Referring to FIG. 9, a memory system includes a semiconductor memory device 100*d* and a host 200*d*. In a production process of the memory system, an address of the bad block BB may be programmed in a nonvolatile volatile memory 220*d* of the host 200*d*.

As described above, the semiconductor memory device 100*d* may include blocks designated as a bad block BB. The semiconductor memory device 100*d* does not need to include address information about a bad block BB of the semiconductor memory device 100*d*. In a cell array 110*d*, a bad block BB may be designated by a block unit like FIG. 7 described above. In FIG. 9, row addresses corresponding to a block BLK2 may be designated as a bad block row address BBRA. The semiconductor memory device 100*d* may include a fuse circuit for cutting off activation of a bad block BB when a word line is selected like a refresh operation.

The host 200*d* controls the semiconductor memory device 100*d*. The host 200*d* may control the semiconductor memory device 100*d* so that the semiconductor memory device 100*d* stores data or can request the semiconductor memory device 100*d* so that data stored in the semiconductor memory device 100*d* is output. The host 200*d* includes a bad block address table 210*d* to cut off an access to a bad block BB. The bad block address table 210*d* may be constituted on a SRAM being driven in the host 200*d*.

The host 200*d* includes the nonvolatile memory 220*d*. The nonvolatile memory 220*d* may store the bad block address BBRA of the semiconductor memory device 100*d* detected in the production process stage. When a booting operation of the memory system is performed, the host 200*d* constitutes a bad block address table 210*d* on the basis of information stored in the nonvolatile memory 220*d*.

For example, if the address information of the bad block BB is only once stored in the host 200d, it can be continuously maintained. Thus, the memory system of which an access to the bad block BB can be cut off without raising the unit cost of production of the semiconductor memory device 200d can be constituted.

Figure 10:
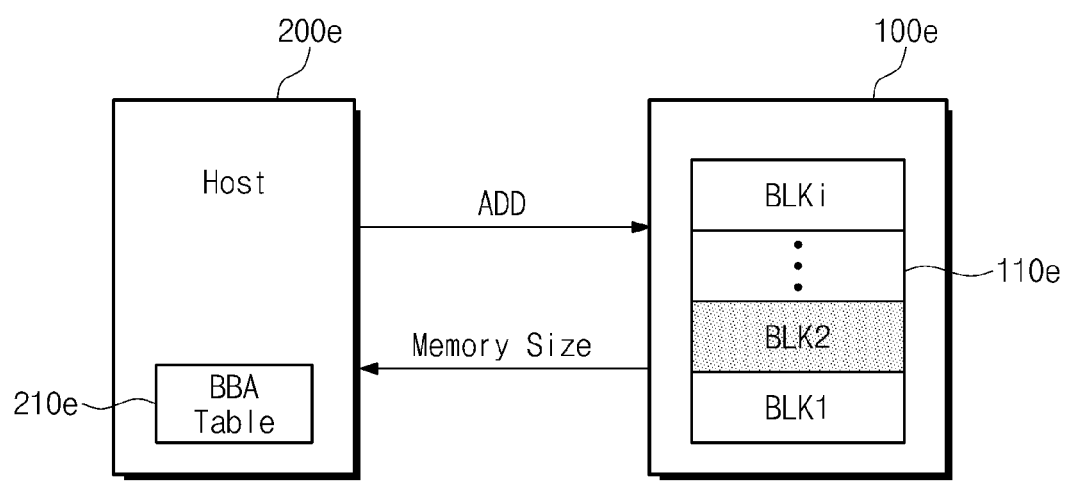
FIG. 10 is a block diagram illustrating a memory system in accordance with yet another exemplary embodiment.

FIG. 10 is a block diagram illustrating a memory system in accordance with yet another exemplary embodiment. Referring to FIG. 10, a memory system includes a semiconductor memory device 100e and a host 200e. The host 200e includes a bad block address table 210e including information about a bad block BB. The semiconductor memory device 100e can provide memory size information to the host 200e. The host 200e can determine a range of a row address that can access to the semiconductor memory device 100e with reference to the memory size information.

The semiconductor memory device 100e may provide no address information of the bad block BB but available memory size information. The memory size information is determined in a test process when the semiconductor memory device 100e is produced. The memory size information is determined as a value obtained by subtracting a memory size corresponding to the bad block BB from the whole integrated memory size of the semiconductor memory device 100e. The memory size information may be stored together with ID information of the semiconductor memory device 100e.

If the memory system is boosted, the host 200e requests ID information and memory size information about the semiconductor memory device 100e first. The semiconductor memory device 100e provides memory size information stored when a test process is performed to the host 200e. The host 200e can determine a range of a row address to be accessed to the semiconductor memory device 100e with reference to the transmitted memory size information.

The semiconductor memory device 100e has to reorder a row address of word lines corresponding to the bad block BB. The semiconductor memory device 100e is internally set so that a row address of word lines corresponding to the bad block BB gets out of a range of an accessible row address constituted by the host 200e. That is, a row address has to be set so that an address of the bad block BB is located to exceed an accessible range from the host 200e. In addition, the semiconductor memory device 100e, although not illustrated, may further include a nonvolatile device storing memory size information.

Figure 11:
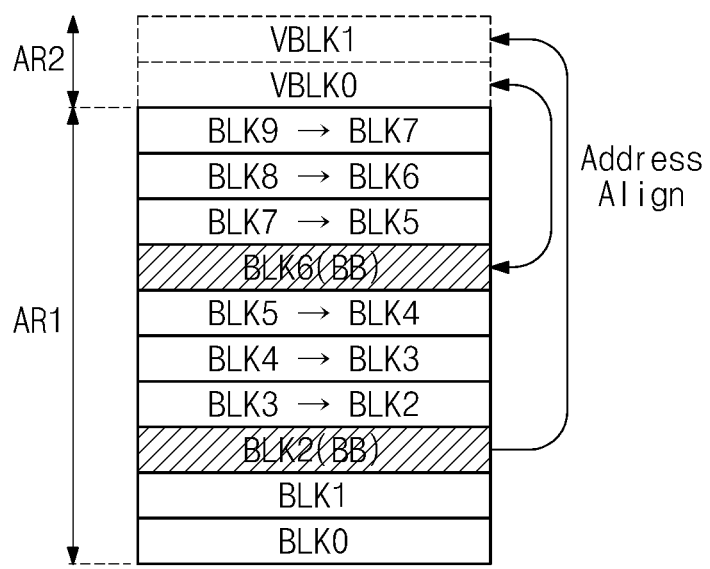
FIG. 11 is a drawing for explaining an address reordering method set in the inside of a semiconductor memory device of FIG. 10 in accordance with an exemplary embodiment.

FIG. 11 is a drawing for explaining an address reordering method set in the inside of a semiconductor memory device of FIG. 10 in accordance with an exemplary embodiment. Referring to FIG. 11, it is assumed that blocks BLK3 and BLK6 correspond to a bad block BB. The semiconductor memory device 100e is set to substitute a row address of the blocks BLK2 and BLK6 with an address of virtual blocks VBLK0 and VBLK1, respectively. For example, a block row address of the semiconductor memory device 100e can be remapped.

The semiconductor memory device 100e remaps the address of the blocks BLK2 and BLK6 to the address of the virtual blocks VBLK1 and VBLK0. The virtual blocks VBLK1 and VBLK0 correspond to a row address range AR2 exceeding a memory size which the semiconductor memory device 100e can provide. A row address of the remaining blocks BLK3~BLK5 and BLK7~BLK9 can be remapped to maintain continuity of row address. For example, the row address of the blocks BLK3~BLK5 and BLK7~BLK9 can be remapped to solve discontinuity that occurs by a remapping of the blocks BLK2 and BLK6. For example, a row address of the blocks BLK3~BLK5 can be remapped to an address of the blocks BLK2~BLK4 and a row address of the blocks BLK7~BLK9 can be remapped to an address of the blocks BLK5~BLK7. The memory size information is stored as a size corresponding to continuous eight blocks BLK0~BLK7 reconstituted by an address remapping. When a request for the memory size from the host 200e occurs, the stored memory size information is output. The host 200e generates a row address so that the host 200e can access to only the continuous eight blocks BLK0~BLK7 reconstituted by an address remapping with reference to the memory size information being provided from the semiconductor memory device 100e.

Figure 12:
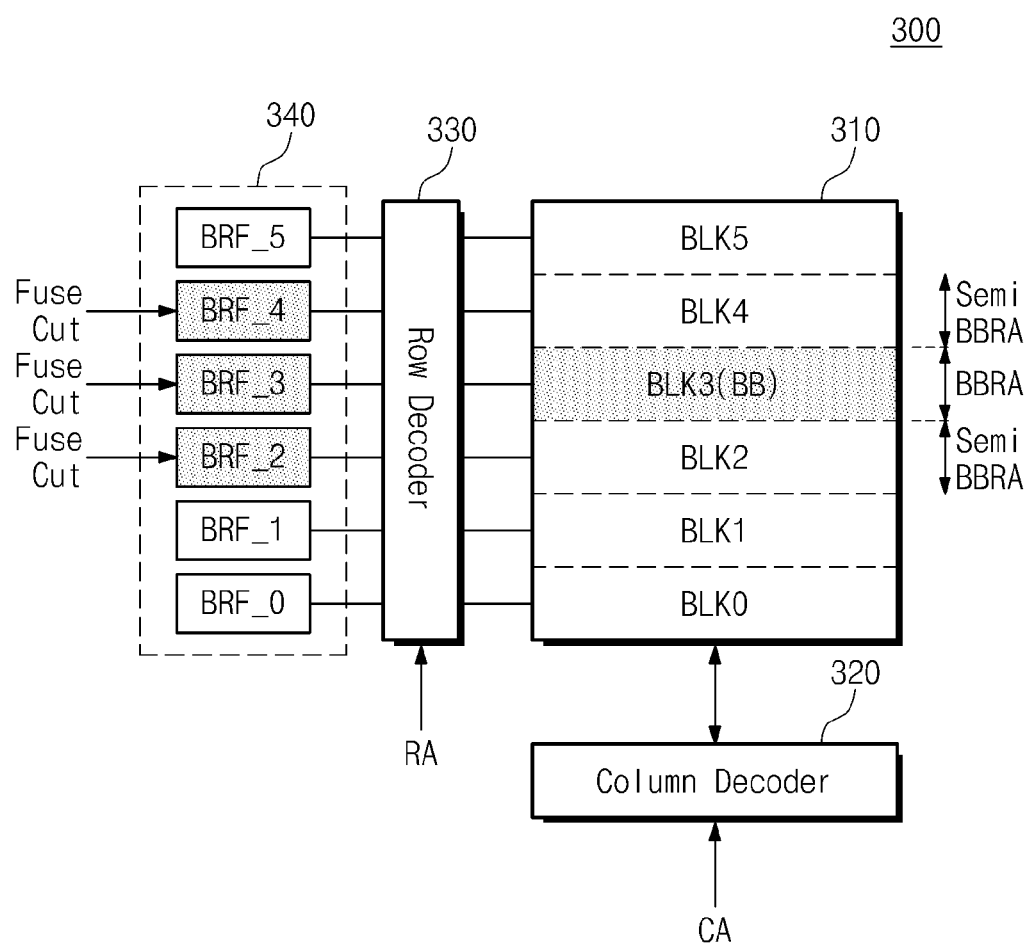
FIG. 12 is a block diagram illustrating a semiconductor memory device in accordance with another exemplary embodiment.

FIG. 12 is a block diagram illustrating a semiconductor memory device in accordance with another exemplary embodiment. Referring to FIG. 12, in a semiconductor memory device 300, in the case that any one block corresponds to a bad block BB, adjacent blocks are also set to be a bad block. To perform that function, the semiconductor memory device 300 includes a cell array 310, a column decoder 320, a row decoder 330 and a fuse block 340. Functions of the column decoder 320 and the row decoder 330 are same as those described in FIG. 3. Thus, a detailed description of the column decoder 320 and the row decoder 330 will be omitted.

The cell array 310 is the same as the cell array 110 of FIG. 3. Memory cells of the cell array 310 may be divided by a block unit. In the case that a defect occurs in any one block, all the rows in which a corresponding defective block exists are designated as a bad block BB. If any one block (for example, BLK3) is designated as a bad block BB, adjacent blocks BLK2 and BLK4 are designated as a semi bad block. Even though the semi bad block does not include a bad block, a block that belongs to a semi bad block is likely to proceed to a bad block in the semiconductor memory device 300 requiring high reliability. Thus, according to a proceeding characteristic of the defect, memory cells adjacent to the bad block BB may be designated as a semi bad block.

An address of rows designated as a bad block BB is designated as a bad block row address BBRA to be access-inhibited. For example, in a refresh operation, an active operation of word lines corresponding to the bad block BB may be cut off. In addition, an address of rows designated as a semi bad block is designated as a bad block row address BBRA to be access-inhibited. For example, in a refresh operation, an active operation of word lines corresponding to the semi bad block may be cut off.

The fuse block 340 is programmed to cut off an access to a row of block unit. The fuse block 340 may include fuse circuits BRF_0~BRF_5 for controlling an access to each of rows of block unit. For example, the fuse circuits BRF_0~BRF_5 store information about whether or not an access to each of the blocks is possible. The fuse circuit BRF_3 may be blown to cut off an access to the block BLK3 designated as a bad block BB. In this case, activation of all word lines included in the block BLK3 is cut off. Even when a refresh operation is performed, word lines included in the block BLK3 are not activated. The fuse circuits BRF 2 and BRF 4 may be blown to cut off activation of word lines included in the semi bad blocks BLK2 and BLK4 adjacent to the block BLK3.

If a defective block exists in any one block to be designated as a bad block BB, fuse circuits corresponding to the semi bad blocks adjacent to the bad block BB are blown. Thus, even if a progressive defect occurs in a block included in the semi bad blocks, it cannot absolutely affect reliability of the semiconductor memory device 300.

Figure 13:
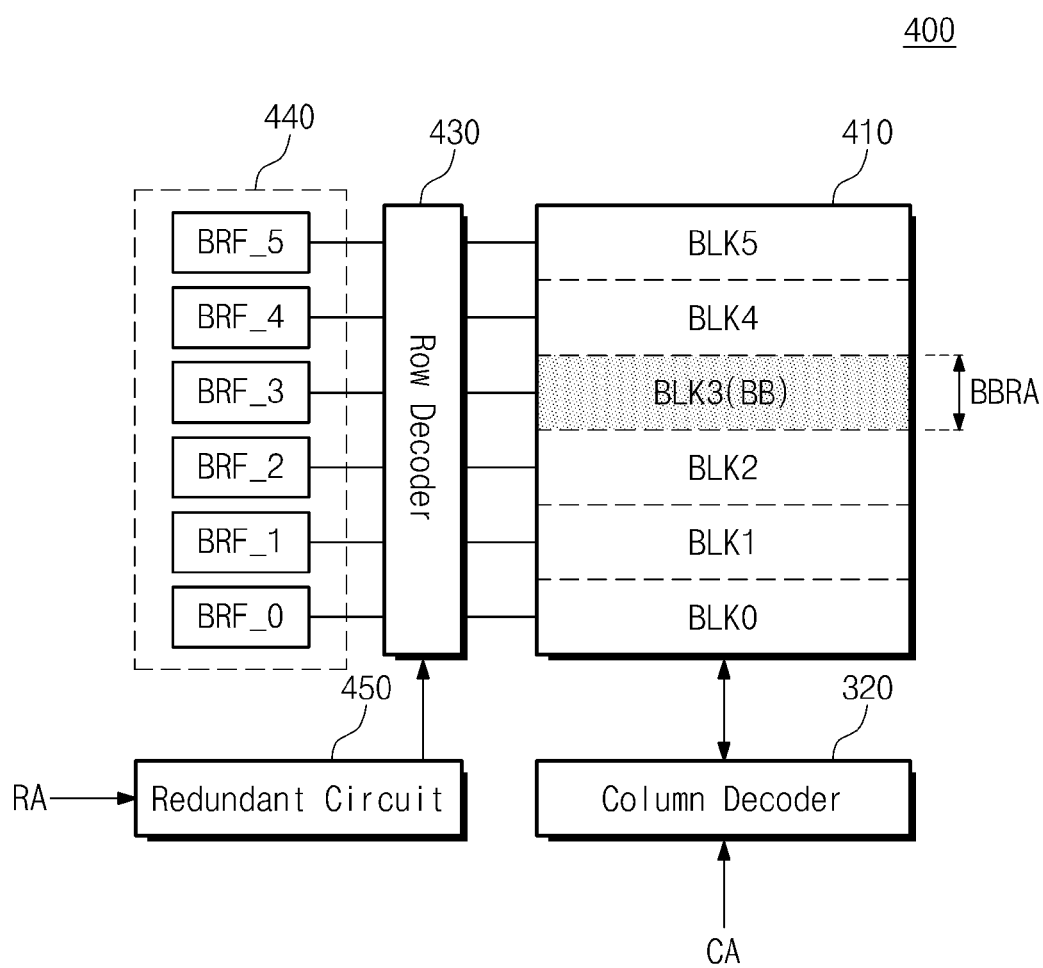
FIG. 13 is a block diagram illustrating a semiconductor memory device in accordance with still another exemplary embodiment.

FIG. 13 is a block diagram illustrating a semiconductor memory device in accordance with still another exemplary embodiment. Referring to FIG. 13, an access to a bad block of a semiconductor memory device 400 is possible and a part of the bad block may be used as a redundant word line. To perform that function, the semiconductor memory device 400 includes a cell array 410, a column decoder 420, a row decoder 430, a fuse block 440 and a redundant circuit 450. The column decoder 420 and the row decoder 430 are same as those described in FIG. 12. Thus, a detailed description of the column decoder 420 and the row decoder 430 will be skipped.

The cell array 410 may include a bad block BB. For example, it is assumed that a block BLK3 is a bad block BB. However, an access to partial word lines of the bad block is possible. The partial word lines of the bad block BB can be selected and an access to the partial word lines of the bad block BB is possible. For example, one of the accessible word lines of the bad block BB may be used as a redundant word line.

In one embodiment, a function of cutting off a selection of the bad block BB of the fuse block 440 may be inactivated. The fuse block 440 may be set so that all the word lines of the bad block BB are selected and activated or set so that only partial word lines among all the word lines of the bad block BB are not activated. For example, the fuse circuit BRF_3 of the fuse block 440 may include a plurality of sub fuse circuits so that only partial word lines among all the word lines of the bad block BB are set not to be activated.

The redundant circuit 450 is set to use a partial word line of the bad block BB as a redundant word line. One of word lines having no defects among partial word lines of the bad block BB is used as a redundant word line. In the case that a specific word line of a block has a defect, a word line among a plurality of word lines included in the bad block BB may replace the defective word line. The redundant circuit 450 includes the repair setting. In the case that a row address RA being input corresponds a defective word line, the redundant circuit 450 replaces the address of the defective word line with a word line included in the bad block BB.

A constitution of the semiconductor memory device 400 was described. The semiconductor memory device 400 provides a bad block row address BBRA to the external, and internally uses a normal word line of the bad block BB as a repair resource. Through those settings, the number of redundant cells that have to be provided for a repair may be reduced.

Figure 14:
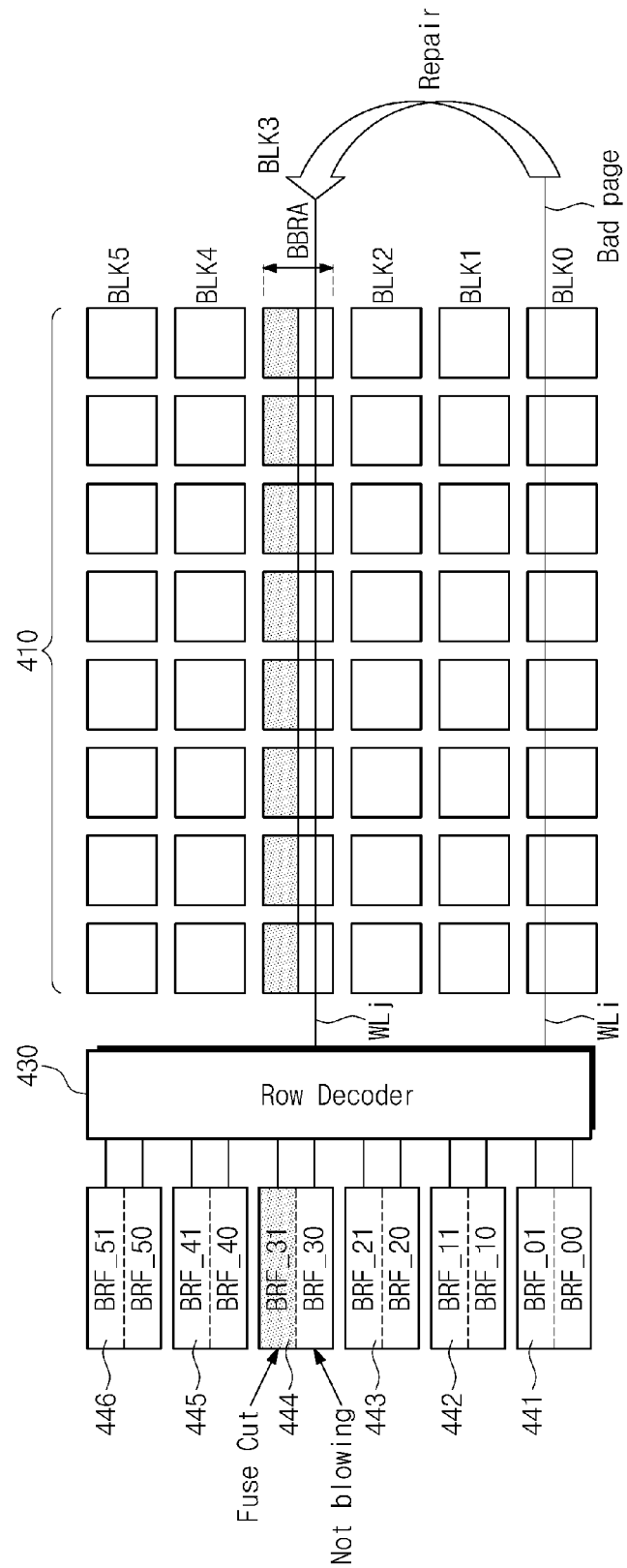
FIG. 14 is a drawing illustrating a repair method of the semiconductor memory device of FIG. 13 in accordance with an exemplary embodiment.

FIG. 14 is a drawing illustrating a repair method of the semiconductor memory device of FIG. 13 in accordance with an exemplary embodiment. Referring to FIG. 14, a partial word line of the bad block BB is used to repair a word line having defect. The setting for a repair is provided by the redundant circuit 450 of FIG. 13 described above.

The cell array 410 can be divided into a plurality of blocks. The blocks are arranged along a row and a column. In any one block among the blocks, defects may exist over a plurality of word lines. It is assumed that a block BLK3 is designated as a bad block BB. A bad block row address BBRA with respect to the block BLK3 detected as a bad block BB is transmitted to the external (for example, a host). The host does not generate a bad block row address BBRA corresponding to the bad block BB.

A defective word line may exist in the cell array 410. It is assumed that a word line WLi of a block BLK0 is a defective word line. The defective word line WLi can be repaired with a word line WLj that exists in the bad block BB by the redundant circuit 450. An access to the defective word line WLi is cut off by a setting of the redundant circuit 450 and an access to the word line WLj of the bad block BB occurs.

The repair operation is possible without a separate fuse blowing. However, to cut off a selection with respect to defective rows of the bad bloc BB in an operation like a self refresh operation, a process of the fuse block 440 may be needed. For example, one block BLK may include a plurality of fuses. The fuse block 440 may be configured such that parts of the fuses are blown and parts of the fuses are accessible in one block BLK. It can be set so that fuses corresponding to partial defective word lines of the bad block BB are blown and fuses corresponding to the remaining word lines (for example, WLj) are not blown. It can be set so that each of fuse circuits 441, 442, 443, 444 and 445 includes a plurality of fuses and a part of the fuse circuit 444 corresponding to the bad block BB is blown. A first fuse BRF_30 of the fuse circuit 444 is not blown and only second fuse BRF_31 is blown and thereby activation of partial rows of the bad block BB may be cut off.

Through that constitution of the fuse block 440, a repair function of the bad block BB is supported and activation of a defective word line can be cut off. As a result, high reliability can be implemented.

Figure 15:
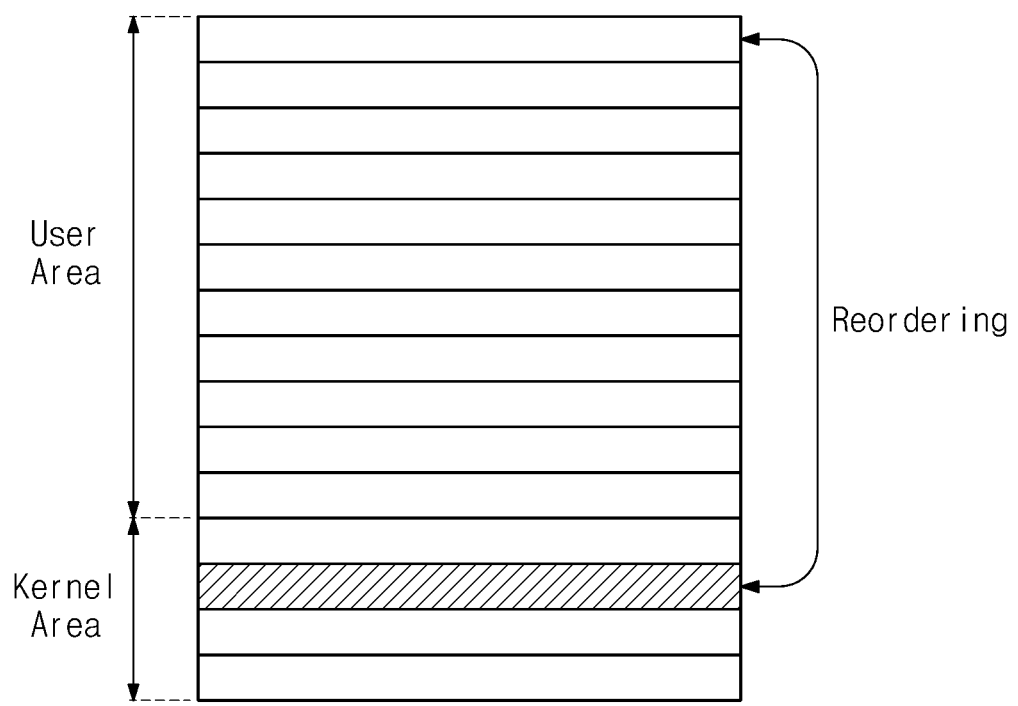
FIG. 15 is a drawing illustrating an address mapping method in accordance with an exemplary embodiment.

FIG. 15 is a drawing illustrating an address mapping method in accordance with an exemplary embodiment. Referring to FIG. 15, in a semiconductor memory device, in the case that a bad block occurs in an area in which important data is stored, an address of a bad block has to be reordered. For example, defects such as a bad block or a bad page should not exist in an area in which, for example, a kernel of an operating system OS is stored. If a memory area in which kernel information of a system is stored is fixed, when a semiconductor memory device is produced, it can be set so that an address of the bad block BB is replaced with a block of an area in which user data is stored.

If an address of a semiconductor memory device in which a kernel of the operating system is stored is flexible, when a system including a semiconductor memory device is produced, an address of the bad block should be changed.

Figure 16:
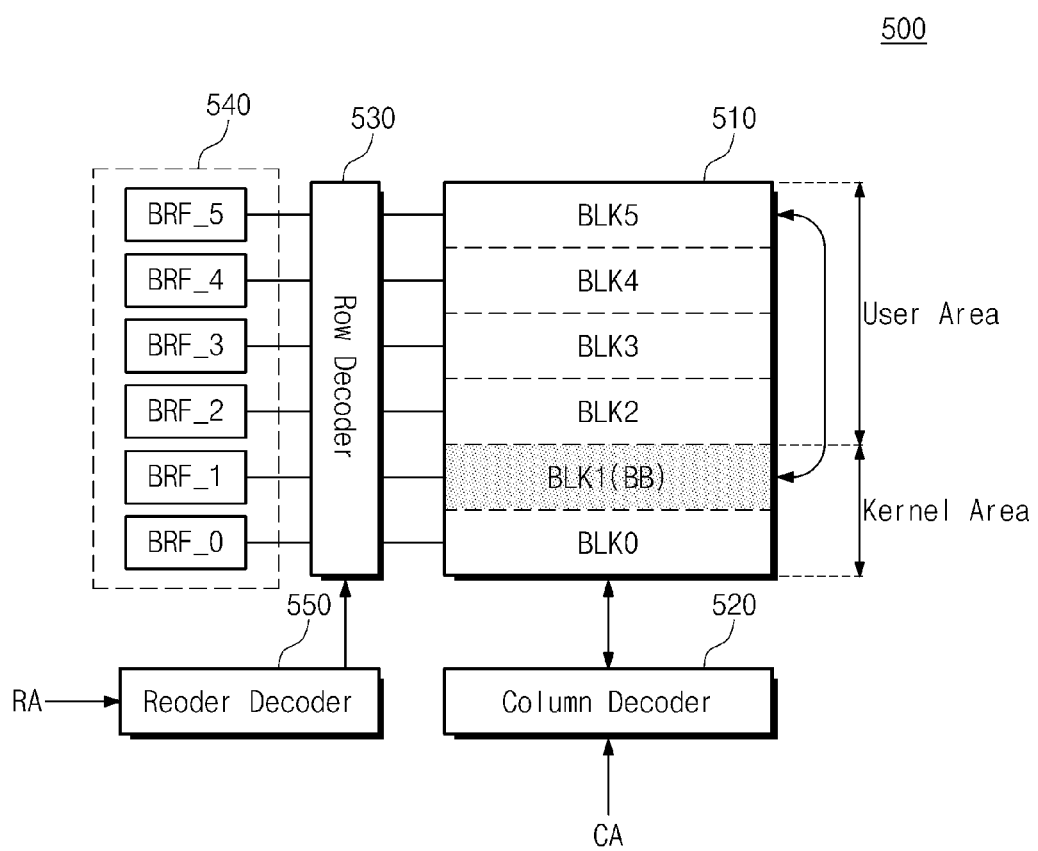
FIG. 16 is a block diagram illustrating a semiconductor memory device performing an address reorder in accordance with an exemplary embodiment.

FIG. 16 is a block diagram illustrating a semiconductor memory device performing an address reorder in accordance with an exemplary embodiment. Referring to FIG. 16, in the case that a bad block BB of a semiconductor memory device 500 stores a system file such as a kernel, the bad block BB can be replaced with a block of an area in which user data is stored. To perform that function, the semiconductor memory device 500 includes a cell array 510, a column decoder 520, a row decoder 530, a fuse block 540 and a reorder decoder 550. The column decoder 520, the row decoder 530 and the fuse circuit 540 are same as those of FIG. 12. Thus, description of the column decoder 520, the row decoder 530 and the fuse block 540 is omitted.

The cell array 510 may be divided into a memory area in which important data is stored and a memory area in which user data is stored. Data like a kernel, if a defect exists, may be fatal to the system. Thus, reliability of important data like the system file should be guaranteed. The data such as a kernel is stored in a kernel area. Data which a user inputs is stored in a user area. However, in the case that a bad block BB exists in the kernel area, reliability of the system is rapidly degraded. Thus, an address reorder should be performed that the bad block that exists in the kernel area is replaced with a block of the user area.

In one embodiment, the address reorder may be performed by a reorder decoder 550. A row address of the bad block BB located in the kernel area is reordered to a row address of the user area by the reorder decoder 550. If an address of the kernel area is flexible, a setting of the reorder decoder 550 may be performed when a system including the semiconductor memory device 500 is produced.

A function of the reorder decoder 550 may be controlled in a host. For example, in the case that an address reorder is needed, a MRS setting of the semiconductor memory device 500 may be performed by a request of the host. According to a MRS setting, an address of the bad block BB that exists in the kernel area of the semiconductor memory device 500 may be replaced with an address of a block in the user area.

Figure 17:
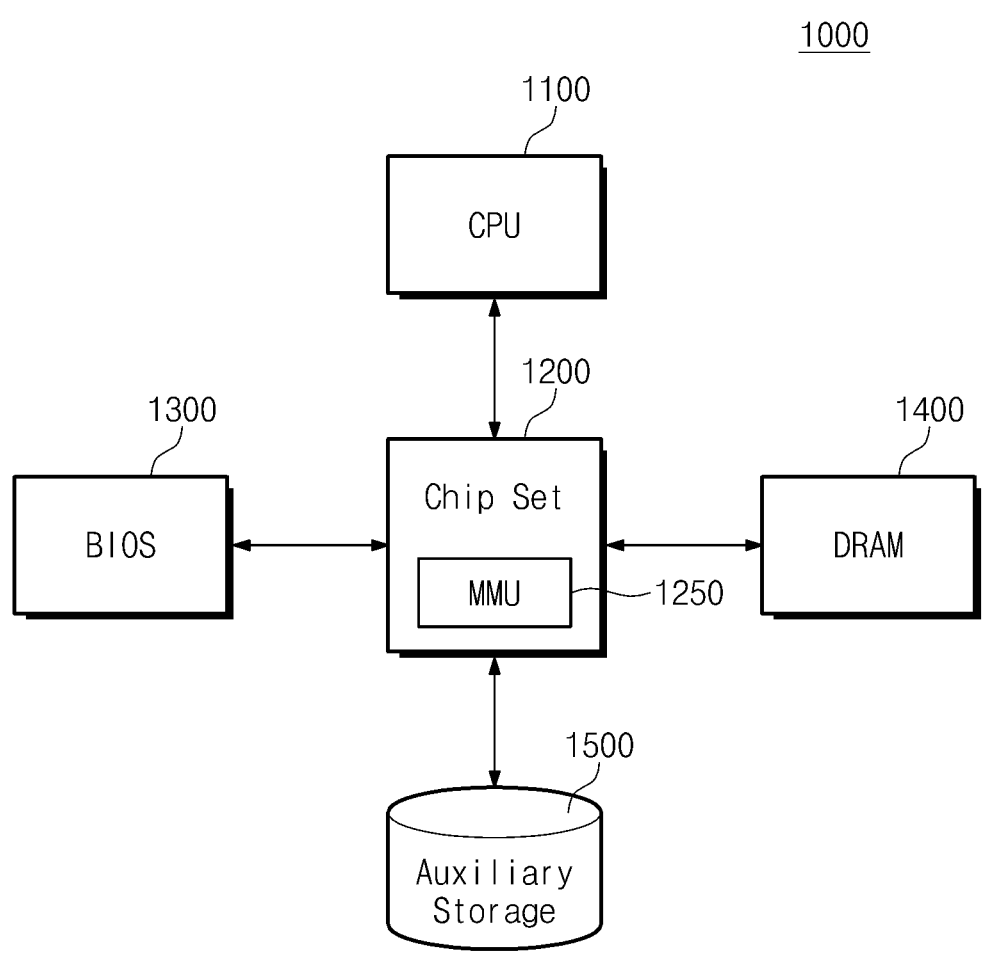
FIG. 17 is a block diagram illustrating a user device in accordance with certain embodiments.

FIG. 17 is a block diagram illustrating a user device in accordance with certain embodiments. Referring to FIG. 17, a user device 1000 (for example, a computer system) includes a central processing unit 1100, a chipset 1200, a ROM 1300, a DRAM 1400 and an auxiliary storage 1500. The DRAM 1400 is provided as a main memory or a working memory of the user device 1000, and is disclosed herein according to example embodiments.

The central processing unit 1100 reads a BIOS or an operating system OS from the ROM 1300 or the auxiliary storage 1500 and executes the BIOS or the operating system OS. When a booting operation of the user device 1000 is performed, the central processing unit 1100 reads a boot program (or boot strap) of a BIOS from the ROM 1300 and executes the boot program. The central processing unit 1100 performs an arithmetic operation for data processing of the user device 1000. The central processing unit 1100 accesses the auxiliary storage 1500 according to a given sequence to drive a program like an operating system OS when a booting operation is performed. The central processing unit 1100 controls the auxiliary storage 1500 and a memory managing unit 1250 so that operating system data stored in the auxiliary storage 1500 is read to be stored in the DRAM 1400. That control operation is only an illustration and the central processing unit 1100 manages all the control operations of the user device 1000.

The chip set 1200 controls various devices being mounted on the user device 1000. To control devices being mounted on the user device 1000, a plurality of control circuits may be built in the chip set 1200. The chip set 1200 may include the memory managing unit 1250 for controlling the DRAM 1400.

The chip set 1200 may be separated into two chip sets of a north bridge and a south bridge. The north bridge is located near the central processing unit 1100 and can control the central processing unit 1100 and the DRAM 1400. For example, the memory managing unit 1250 may be included in the north bridge. Although not illustrated, expansion card slots for a high speed such as an AGP, a PCI express, etc. are controlled by the north bridge. However, a constitution and a role of the chip set 1200 are not limited to the aforementioned description. The central processing unit 1100 may include the memory managing unit.

The ROM 1300 stores BIOS. The BIOS supports the most basic processing routine of the user device 1000. For example, the BIOS includes a start-up routine, a service processing routine and a hard ware interrupt routine. The start-up routine performs a POST work and an initialization work when the user device 1000 is booted. The service processing routine processes a work which the operating system OS or an application program requests.

The DRAM 1400 is a main or a working memory and is driven in the user device 1000. The DRAM 1400 can be accessed by a byte unit and is a rewritable nonvolatile memory device. An operation system OS, an application program being driven and data being updated are stored in the DRAM 1400 being used as a working memory when the user device 1000 is driven. The DRAM 1400 can transmit information about the bad block BB to the chip set 1200. The DRAM 1400 can cut off activation of the bad block BB through a fuse setting when necessary.

The auxiliary storage 1500 stores data such as user data, an operating system OS, an application program, etc. The auxiliary storage 1500 may be one of, for example, a hard disk driver (HDD), a solid state driver (SSD) and a hybrid hard disk driver (Hybrid HDD). The auxiliary storage 1500 is a high storage device and may store a program, a code or setting data being driven in the user device 1000. However, the auxiliary storage 1500 is not limited to those examples described above.

The user device 1000 may further include a user interface, a battery, a modem, etc. Although not illustrated, an application chipset, a camera image processor CIS, a mobile DRAM, etc. may be further provided to the user device 1000.

The user device 1000 can be mounted by various types of packages. For example, the user device 1000 can be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

According to the above-disclosed embodiments, even if defects occur by a block unit, a semiconductor memory device that can be provided as a good product can be embodied. Thus, Reliability of a semiconductor memory device being reduced with the increase of integration and performance may be increased.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor memory device comprising:
   a cell array including a plurality of memory cells, each memory cell connected to a word line and a bit line, the cell array divided into a plurality of blocks, each block including a plurality of word lines, the plurality of blocks including at least a first defective block;
   a nonvolatile storage circuit configured to store address information of the first defective block, and to output the address information to an external device; and
   a fuse circuit including a plurality of fuses, and configured to cut off an activation of word lines of the first defective block by blowing a fuse of the plurality of fuses.

2. The semiconductor memory device of claim 1, wherein the first defective block includes a first set of memory cells electrically connected to a sub word line driver connected to a corresponding word line and a bit line sense amplifier connected to corresponding bit lines.

3. The semiconductor memory device of claim 2, wherein the address information corresponds to a start address and an end address of rows of the first defective block.

4. The semiconductor memory device of claim 1, wherein the fuse circuit is set to cut off an activation of all the word lines of the first defective block.

5. The semiconductor memory device of claim 1, wherein the fuse circuit is configured to cut off an activation of a first set of word lines of the first defective block.

6. The semiconductor memory device of claim 5, wherein a second word line included in the first defective block is remapped to become a redundant word line for repairing a defective word line of the cell array.

7. The semiconductor memory device of claim 6, further comprising a redundant circuit to remap the second word line as the redundant word line.

8. The semiconductor memory device of claim 1, wherein the fuse circuit is configured to cut off an activation of word lines included in a block adjacent to the first defective block.

9. The semiconductor memory device of claim 1, further comprising a reorder decoder configured such that the first defective block is replaced with a second block of the cell array,
wherein the cell array includes a user area including the second block and a kernel area including the first defective block.

10. A memory system comprising:
a memory device comprising:
a memory cell array including a plurality of memory cells each connected to a word line, and divided into a first set of blocks, and a second set of blocks that includes at least a first defective block, each block including a plurality of word lines; and
a row decoder configured to inactivate a first set of word lines in the second set of blocks,
wherein the first and second sets of blocks correspond to row addresses; and
a host configured to receive address information of the second set of blocks, and access the memory device based on the address information,
wherein the memory device further includes:
a storage circuit configured to store address information of the second set of blocks, and to provide the address information to the host; and
a fuse circuit configured such that the row decoder inactivates the first set of word lines of the second set of blocks.

11. The memory system of claim 10, wherein the memory device further includes a reorder decoder configured to replace a row address of the first defective block with a row address of the first set of blocks.

12. The memory system of claim 10, wherein the memory device further includes a redundant circuit that replaces a defective word line of the first set of blocks with a first word line of the first defective block.

13. The memory system of claim 10, wherein the second set of blocks includes a second block disposed adjacent to the first defective block, the second block having no defective cells.

* * * * *